(12) United States Patent
Park et al.

(10) Patent No.: US 11,940,617 B2
(45) Date of Patent: Mar. 26, 2024

(54) DRIVE CIRCUIT FOR RESONANT MIRROR SCANNING SYSTEM

(71) Applicant: Microsoft Technology Licensing, LLC, Redmond, WA (US)

(72) Inventors: Chang Joon Park, Sunnyvale, CA (US); Martin Francis Galinski, III, Mountain View, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 909 days.

(21) Appl. No.: 16/945,349

(22) Filed: Jul. 31, 2020

(65) Prior Publication Data
US 2022/0035150 A1    Feb. 3, 2022

(51) Int. Cl.
| | |
|---|---|
| *B06B 1/02* | (2006.01) |
| *G02B 26/08* | (2006.01) |
| *G02B 26/10* | (2006.01) |
| *G02B 27/01* | (2006.01) |
| *H03H 7/01* | (2006.01) |
| *H03H 7/00* | (2006.01) |

(52) U.S. Cl.
CPC ........ *G02B 26/0858* (2013.01); *B06B 1/0207* (2013.01); *G02B 26/10* (2013.01); *G02B 27/0176* (2013.01); *H03H 7/1708* (2013.01); *H03H 7/175* (2013.01); *G02B 2027/0154* (2013.01); *H03H 2007/006* (2013.01)

(58) Field of Classification Search
CPC .......................... H02N 2/0075; H10N 30/802
USPC ....................................................... 310/317
See application file for complete search history.

(56) References Cited

U.S. PATENT DOCUMENTS

| | | | |
|---|---|---|---|
| 10,578,861 B2 | 3/2020 | Galinski et al. | |
| 2015/0161926 A1 | 6/2015 | Ogi et al. | |
| 2015/0219875 A1* | 8/2015 | Bansal | G02B 26/0841 318/116 |
| 2019/0020860 A1 | 1/2019 | Mcvittie | |
| 2019/0121121 A1* | 4/2019 | Galinski, III | B81B 3/0021 |

FOREIGN PATENT DOCUMENTS

WO    2019083752 A1    5/2019

OTHER PUBLICATIONS

"International Search Report and Written Opinion Issued in PCT Application No. PCT/US21/029520", dated Oct. 27, 2021, 10 Pages.

* cited by examiner

*Primary Examiner* — Derek J Rosenau
(74) *Attorney, Agent, or Firm* — Alleman Hall & Tuttle LLP

(57) ABSTRACT

Examples are disclosed herein that relate to driving a resonant scanning mirror system using a linear LC resonant driving scheme. In one example, a resonant scanning mirror system includes a scanning mirror, first and second mirror drive elements, and a drive circuit to drive the scanning mirror at a resonant frequency. The drive circuit includes one or more signal sources configured to create a first source signal and a second source signal that is 180 degrees out of phase with the first source signal. The drive circuit further includes a buffer stage configured to receive the first and second source signals and output first and second drive signals, a first resonant LC stage configured to amplify the first drive signal for provision to the first mirror drive element, and a second resonant LC stage configured to amplify the second drive signal for provision to the second mirror drive element.

20 Claims, 8 Drawing Sheets

DRIVE CIRCUIT FOR RESONANT MIRROR SCANNING SYSTEM

BACKGROUND

A mobile display device may employ a scanned beam projector utilizing a micro-electromechanical system (MEMS) resonant scanning mirror. MEMS resonant scanning mirrors may be well-suited for mobile display devices due to the ability of the MEMS resonant scanning mirror to generate a high-quality image while having a relatively small size and a low weight.

SUMMARY

Examples are disclosed herein that relate to driving a resonant scanning mirror system using a linear LC resonant driving scheme. In one example, a resonant scanning mirror system includes a scanning mirror, first and second mirror drive elements, and a drive circuit to drive the scanning mirror at a resonant frequency. The drive circuit includes one or more signal sources configured to create a first source signal and a second source signal that is 180 degrees out of phase with the first source signal. The drive circuit further includes a buffer stage configured to receive the first and second source signals and output first and second drive signals, a first resonant LC stage configured to amplify the first drive signal for provision to the first mirror drive element, and a second resonant LC stage configured to amplify the second drive signal for provision to the second mirror drive element.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

A resonant scanning mirror system in a display device utilizes an alternating current (AC) drive voltage to actuate a scanning mirror at a mechanical resonant frequency of the mirror. The AC drive voltage is significantly higher than a maximum direct current (DC) voltage that can be provided by a battery of the display device. As such, a drive circuit may be configured to convert the available DC voltage to a higher AC voltage. As one example, a drive circuit can include an H-bridge comprising a plurality of switches to generate a suitably high AC voltage. However, such a drive circuit utilizes a boost converter, which can be relatively large and thus complicate the design of a small device. Additionally, the switching behavior of the H-bridge results in some power loss that reduces the efficiency of such a drive circuit.

Accordingly, the present description is directed to a display device comprising a resonant scanning mirror system and a drive circuit configured to drive the resonant scanning mirror system at a resonant frequency using a linear LC resonant driving scheme. Such a configuration boosts voltages only at and adjacent to the resonant frequency of the resonant scanning mirror system, and thus may be more power efficient than circuits that amplify all frequencies. Moreover, controlling the AC voltage in this manner can help to increase a reliability of the drive circuit, as the electrical components of the drive circuit are exposed to high AC voltages less often. Additionally, the disclosed circuits may be smaller in size than prior drive circuits. Furthermore, as described below, in some implementations the drive circuit may have a resonant LC stage that includes a coupled inductor that is configured to amplify a drive signal for driving mirror drive elements of the resonant scanning mirror system. By using the coupled inductor, a size of the drive circuit may be reduced relative to a drive circuit that employs two or more discreate inductors.

Figure 1:
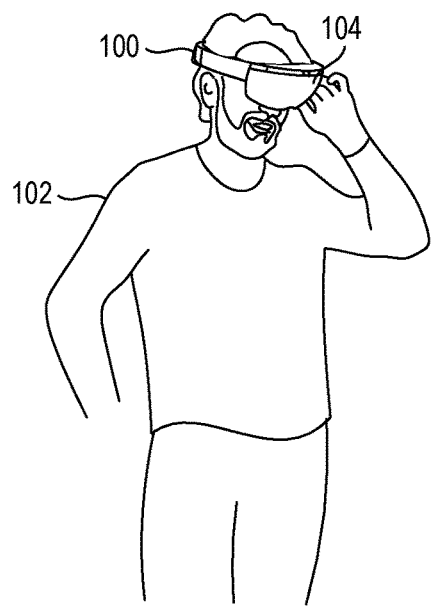
FIG. 1 shows an example display device that includes a resonant scanning mirror system.

FIG. 1 shows an example head-mounted device (HMD) 100 worn by a user 102. The HMD 100 includes a see-through display 104 configured to present virtual imagery to provide the user 102 with an augmented reality experience. The HMD 100 comprises a MEMS resonant scanning mirror system as an image source for visually presenting virtual imagery on the see-through display 104. The HMD 100 is provided as a non-limiting example of a display device that comprises a resonant scanning mirror system and corresponding drive circuit, and the disclosed examples of resonant scanning mirror systems and drive circuits may be implemented in any suitable type of display device.

Figure 2:
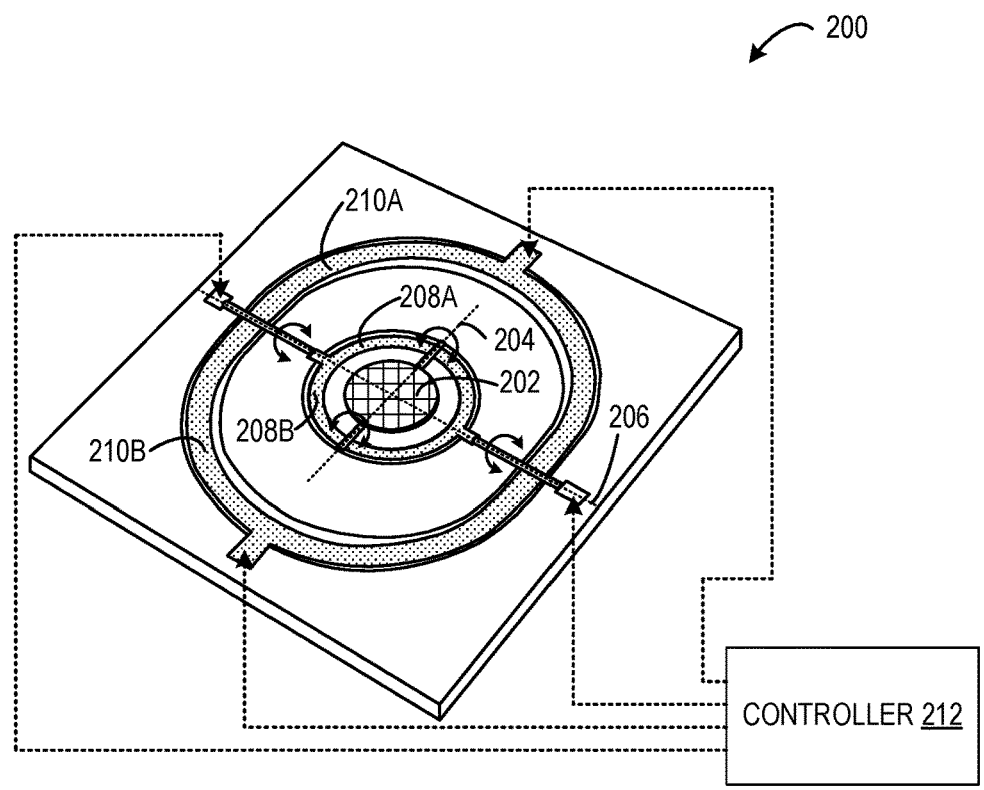
FIG. 2 shows an example resonant scanning mirror system.

FIG. 2 shows an example resonant scanning mirror system 200. The resonant scanning mirror system 200 comprises a scanning mirror 202 that is supported along two orthogonally pivoting axes 204, 206. Vertical scan and horizontal scan are controlled via mirror drive elements that pivot the scanning mirror 202 about the axes 204, 206. In this example, the first mirror drive element comprises a first piezoelectric actuator 208A and a second piezoelectric actuator 208B, which are operable to drive the mirror in a first scan direction via harmonic oscillation. This scan direction can be referred to as a fast scan direction. In the fast scan direction, the mirror scans a beam of light in a sinusoidal manner at a relatively higher frequency. The second mirror drive element comprises a third piezoelectric actuator 210A and a fourth piezoelectric actuator 210B, which drive the mirror in a second scan direction orthogonal to the first scan direction. This scan direction can be referred to as a slow scan direction. In the slow scan direction, the mirror can be driven via a control signal having a sawtooth-type nature, such that the mirror angle changes more slowly while the beam of light is scanned back and forth in the fast direction to scan an image. Upon completion of scanning an image, the resonant scanning mirror system 200 resets more quickly in the slow scan direction (e.g. following a steeper portion of a sawtooth-like control signal) to begin scanning a next image.

The first and second mirror drive elements 208A, 208B for the fast scan direction are driven by 180 degree out-of-phase sinusoidal signals. By applying oscillating electrical alternating current (AC) voltages to the respective drive elements, the scanning mirror 202 is caused to oscillate, thereby causing appropriate scanning to occur. Such oscillation can be efficiently obtained and maintained based on the first and second drive elements 208a, 208b being driven at a mechanical resonant frequency of the resonant scanning mirror system 200 in the fast scan direction.

As mentioned above, the AC drive voltages required to actuate the resonant scanning mirror system 200 may be significantly higher than a maximum DC voltage that can be provided by a battery of the HMD 100 (shown in FIG. 1). For example, the AC drive voltage may be in the order of 30 to 100 volts, whereas the DC voltage provided by the battery may be in the order of 3-10 volts. As such, in accordance with the concepts described herein, a high AC drive voltage is attained at the mechanical resonant frequency of the scanning mirror system 200 using a linear inductive-capacitive (LC) resonant driving scheme employed by a drive circuit so as to efficiently drive the resonant scanning mirror system 200. Such a drive circuit may have increased power efficiency and a smaller form factor compared to previous drive circuits.

Figure 3:
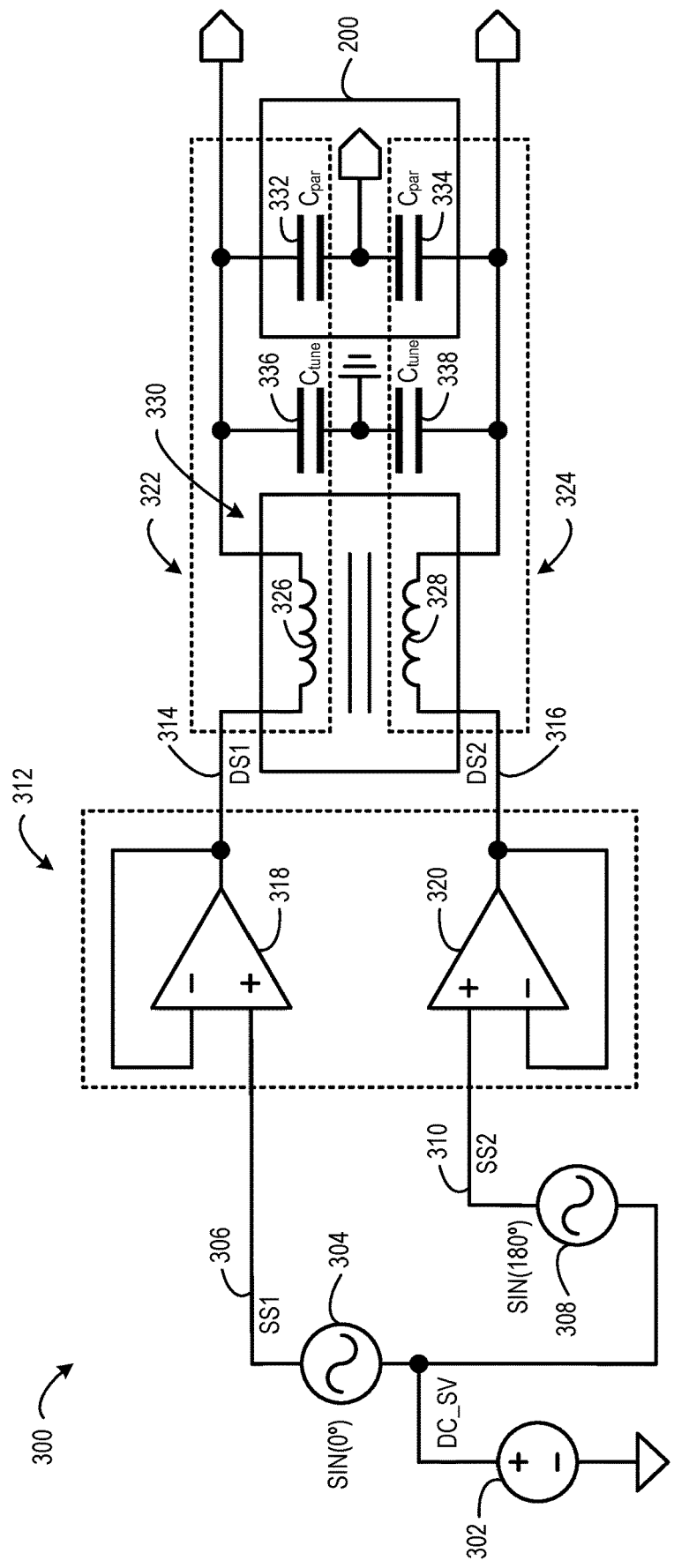
FIGS. 3-6 show example drive circuits configured to drive a resonant scanning mirror system.

FIG. 3 shows an example drive circuit 300 configured to drive the scanning mirror system 200 (or any other suitable resonant scanning mirror system) at a resonant frequency. The drive circuit 300 comprises a voltage source 302 configured to output a DC source voltage. The voltage source 302 may take any suitable form, such as one or more batteries.

The drive circuit 300 comprises a first signal source 304 configured to create a first source signal 306 (SS1) (illustrated here by a conductor that carries the first source signal 306) based on the DC source voltage (DC_SV), and a second signal source 308 configured to create a second source signal 310 (SS2) based on the DC source voltage. The first and second signal sources 304, 308 are configured such that the first source signal 306 is 180 degrees out of phase with the second source signal 310. For example, the first and second signal sources 304, 308 may be configured to convert the DC power provided by the voltage source 302 to differential mode AC power. In the depicted example, the first and second source signals are sinusoidal signals. In other examples, the first and second source signals may take other forms, such as triangle waves or square waves. In some examples, the first and second signal sources comprise outputs of a digital micro-controller. In other examples, the first and second signal sources may comprise discrete electronic components. In still other examples, the first and second source signals may be created by a single signal source and either of the source signals may be converted to be 180 degrees out of phase with the other source signal.

The drive circuit 300 comprises a buffer stage 312 configured to receive the first source signal 306 and the second source signal 310 and to output a first drive signal 314 (DS1) and a second drive signal 316 (DS2). In the depicted example, the buffer stage 312 comprises an operational amplifier stage including a first operational amplifier 318 and a second operational amplifier 320, wherein the high input impedance and low output impedance of the operational amplifiers buffer the signal sources from circuit elements downstream of the operational amplifiers. In the depicted example, the first and second operational amplifiers 318, 320 comprise unity gain amplifiers, such that the first and second drive signals 314, 316 have effectively a same voltage as the first and second source signals 306, 310 provided as input to the buffer stage 312. In other examples, the buffer stage 312 may provide a different gain. In other examples, components other than operational amplifiers may be used for the buffer stage 312. The buffer stage 312 may comprise any suitable electrical component(s) that are configured to buffer the source signals 306, 310.

The drive circuit 300 comprises a first resonant LC stage 322 and a second resonant LC stage 324. The first resonant LC stage 322 is configured to amplify the first drive signal 314 for provision to the mirror drive element 208a (shown in FIG. 2) of the resonant scanning mirror system 200, and the second resonant LC stage 324 is configured to amplify the second drive signal 316 for provision to the mirror drive element 208b. The first resonant LC stage 322 is configured to use an inductance in conjunction with a capacitance $C_{par}$ of a first modeled parasitic capacitor 332 of the resonant scanning mirror system 200 to amplify a differential AC voltage of the first drive signal 314 at a mechanical resonant frequency of the resonant scanning mirror system 200. Similarly, the second resonant LC stage 324 is configured to use an inductance in conjunction with a capacitance $C_{par}$ of a second modeled parasitic capacitor 334 of the resonant scanning mirror system 200 to amplify a differential AC voltage of the second drive signal 316 at a mechanical resonant frequency of the resonant scanning mirror system 200. The first and second modeled parasitic capacitors 332, 334 represent capacitances $C_{par}$ that are inherent to the resonant scanning mirror system 200.

In the depicted example, the first resonant LC stage 322 comprises a first winding 326 of a coupled inductor 330 and the second resonant LC stage 324 comprises a second winding 328 of the coupled inductor 330. The core of the coupled inductor 330 may take any suitable form. In one example, the core may have a toroidal shape. By employing the coupled inductor 330 in the drive circuit 300, an overall size of the coupled inductor 330 may be less than a size of other drive circuit configuration that employ two discrete inductors. Moreover, the coupled inductor 330 may provide a greater inductance than discrete inductors due to the mutual inductance between the first and second windings. In this way, the first and second LC stages 322, 324 amplify the first and second drive signals 314, 316 at the resonant frequency of the resonant mirror system 200 in an efficient manner, since the first and second drive signals 314, 316 are amplified less, or not all, at frequencies other than those close to or at the mechanical resonant frequency of the resonant scanning mirror system 200.

The inductors and capacitors of the first and second resonant LC stages 322, 324 may have any suitable values to amplify the drive signals to the resonant frequency of the resonant scanning mirror system 200. In one example, the inductances of the first and second windings 326, 328 are approximately the same. Likewise, the first and second modeled parasitic capacitors 332, 334 may have approximately the same capacitances. In other examples, the inductors may have different inductances and/or the capacitors may have different capacitances.

In some examples, the first and second resonant LC stages 322, 324 optionally may comprise first and second tuning capacitors 336, 338. The first and second tuning capacitors 336, 338 coupled between an output of the coupled inductor 330 and a fixed voltage terminal, which may be common ground. The optional tuning capacitor(s) 336, 338 allow for some deviation in the actual capacitance $C_{par}$ of the resonant scanning mirror system 200 that may occur due, for example, to manufacturing tolerances used in fabrication of the resonant scanning mirror system 200. In particular, slight fabrication deviations in the resonant scanning mirror system 200 can cause the actual mechanical resonant frequency of the resonant scanning mirror system 200 to vary from the designed mechanical resonant frequency. In other examples, either or both tuning capacitors may be omitted.

The drive circuit 300 provides a linear LC resonant driving scheme that boosts signals near the resonant frequency and shows unity gain at other operating frequencies below the target resonant frequency. Such operation enables driving performance having increased reliability and efficiency relative to other drive circuit configurations. For example, a drive circuit that directly drives high voltage signals to drive elements of a resonant scanning mirror system can have excessive voltage swings due to process, voltage, and temperature (PVT) variations of the resonant scanning mirror system, which can cause damage to the resonant scanning mirror system. Moreover, since the drive signals are amplified only near the target resonant frequency, less stress may be applied to the electrical components of the drive circuit 300 relative to other drive circuits that amplify voltages across different frequencies. Additionally, the cross-coupled inductor employed in the resonant LC stages provides a compact design that reduces a size of the drive circuit 300 relative to other drive circuits that comprise discrete inductors and/or other electronic components. Further, by employing linear LC resonant amplification, power efficiency may be increased relative to a drive circuit configuration that employs a switching device (e.g., an H-bridges) that suffers power losses due to switching behavior.

Figure 4:
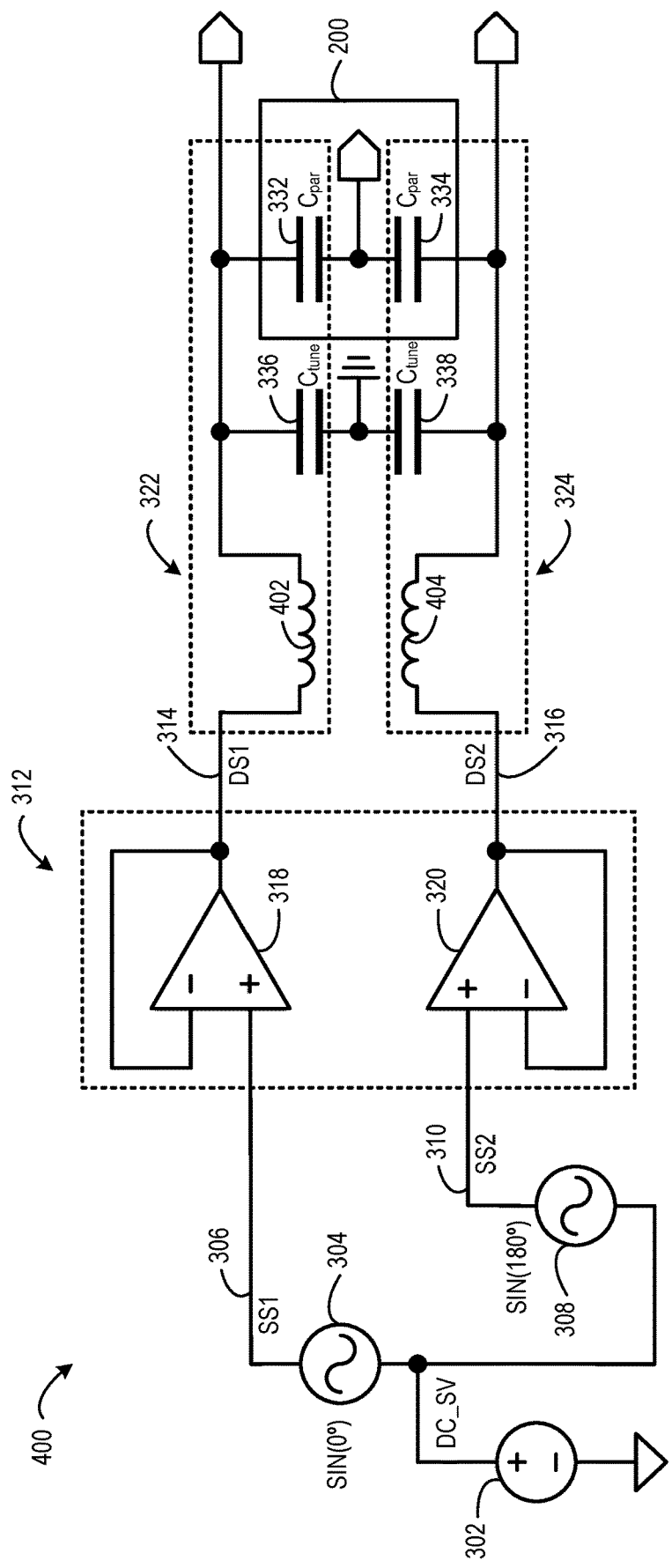

FIG. 4 shows another example drive circuit 400. The drive circuit 400 differs from the drive circuit 300 in that the first resonant LC stage 322 comprises a first discrete inductor 402 and the second resonant LC stage 324 comprises a second discrete inductor 404. These discrete inductors 402, 404 may work in conjunction with the modeled parasitic capacitors 332, 334 (and optionally the tuning capacitors 336, 338) to amplify the drive signals 314, 316 at the resonant frequency of the resonant scanning mirror system 200. The discrete inductors 402, 404 may be less efficient and larger in size than the coupled inductor 330 of the drive circuit 300 (shown in FIG. 3), but otherwise may provide suitable amplification of the drive signals 314, 316 to appropriately operate the resonant scanning mirror system 200.

Figure 5:
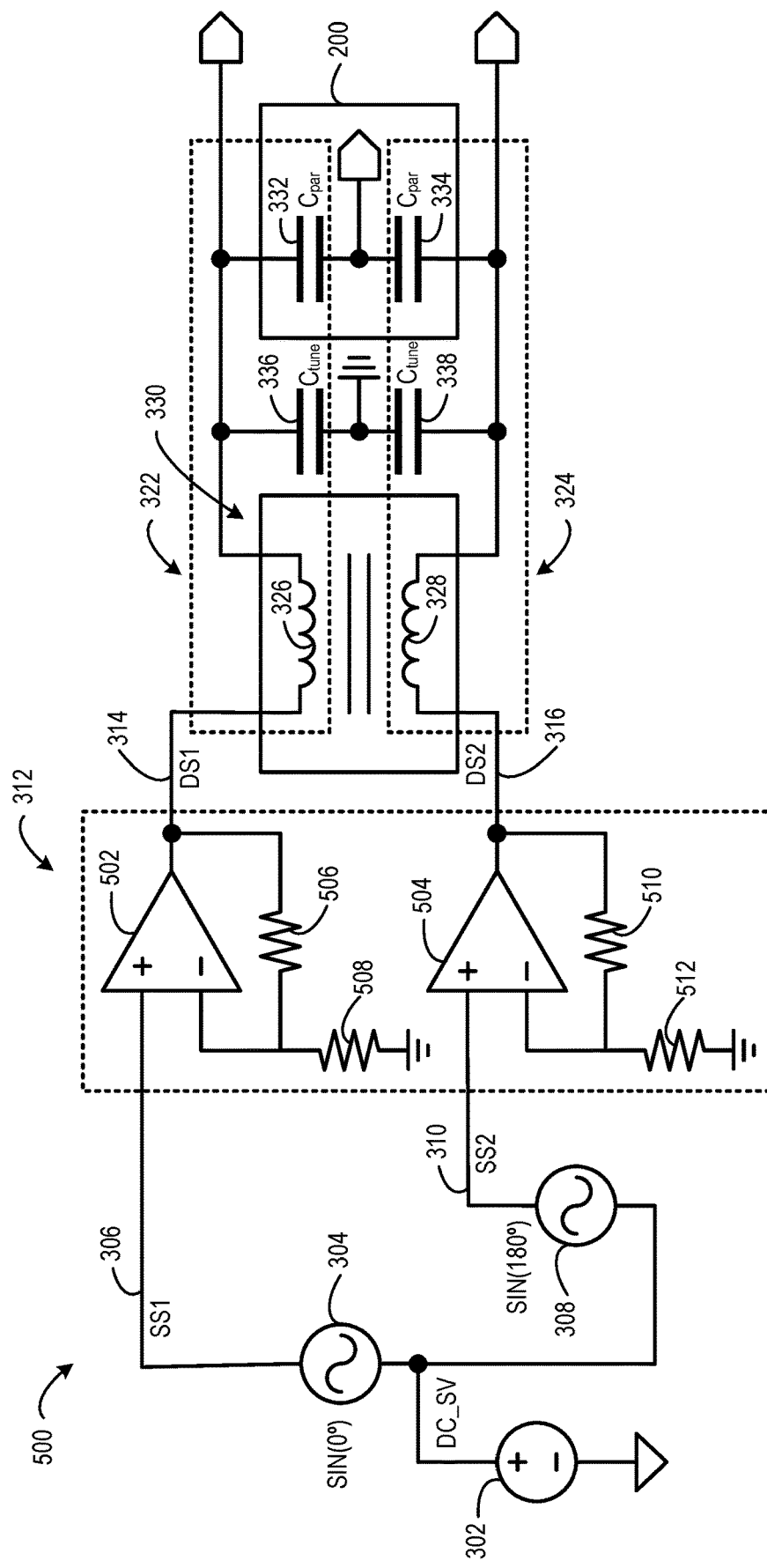

FIG. 5 shows another example drive circuit 500. The drive circuit 500 differs from the drive circuit 300 in that the buffer stage 312 includes operational amplifiers that not only buffer the source signals 306, 310, but also provide gain, such that the drive signals 314, 316 have a different (e.g. higher) voltage than the source signals. In this example, the buffer stage 312 comprises a noninverting operational amplifier stage including a first operational amplifier 502 and a second operational amplifier 504. A first resistor 506 is electrically connected between a negative input terminal of the first operational amplifier 502 and an output terminal of the first operational amplifier 502. A second resistor 508 is electrically connected between the negative input terminal of the first operational amplifier 502 and common ground (or another suitable reference). The first and second resistors 506, 508 form a simple potential divider across the non-inverting amplifier terminal of the first operational amplifier 502 with the voltage gain of the first operational amplifier 502 being determined based on the ratio of the resistance values of the first and second resistors 506, 508. The first and second resistors 506, 508 may have any suitable resistance values to provide any suitable gain to the first source signal 306 to generate the first drive signal 314.

Furthermore, a third resistor 510 is electrically connected between a negative input terminal of the second operational amplifier 504 and an output terminal of the second operational amplifier 504. A fourth resistor 512 is electrically connected between the negative input terminal of the second operational amplifier 504 and common ground. The third and fourth resistors 510, 512 form a simple potential divider across the non-inverting amplifier terminal of the second operational amplifier 504 with the voltage gain of the second operational amplifier 504 being determined based on the ratio of the resistance values of the third and fourth resistors 510, 512. The third and fourth resistors 510, 512 may have any suitable resistance values to provide any suitable gain to the second source signal 310 to generate the second drive signal 316. In other examples, the buffer stage may utilize inverting amplifiers, and/or may be configured as differentiators, integrators, and/or any other suitable type of amplifier.

Figure 6:
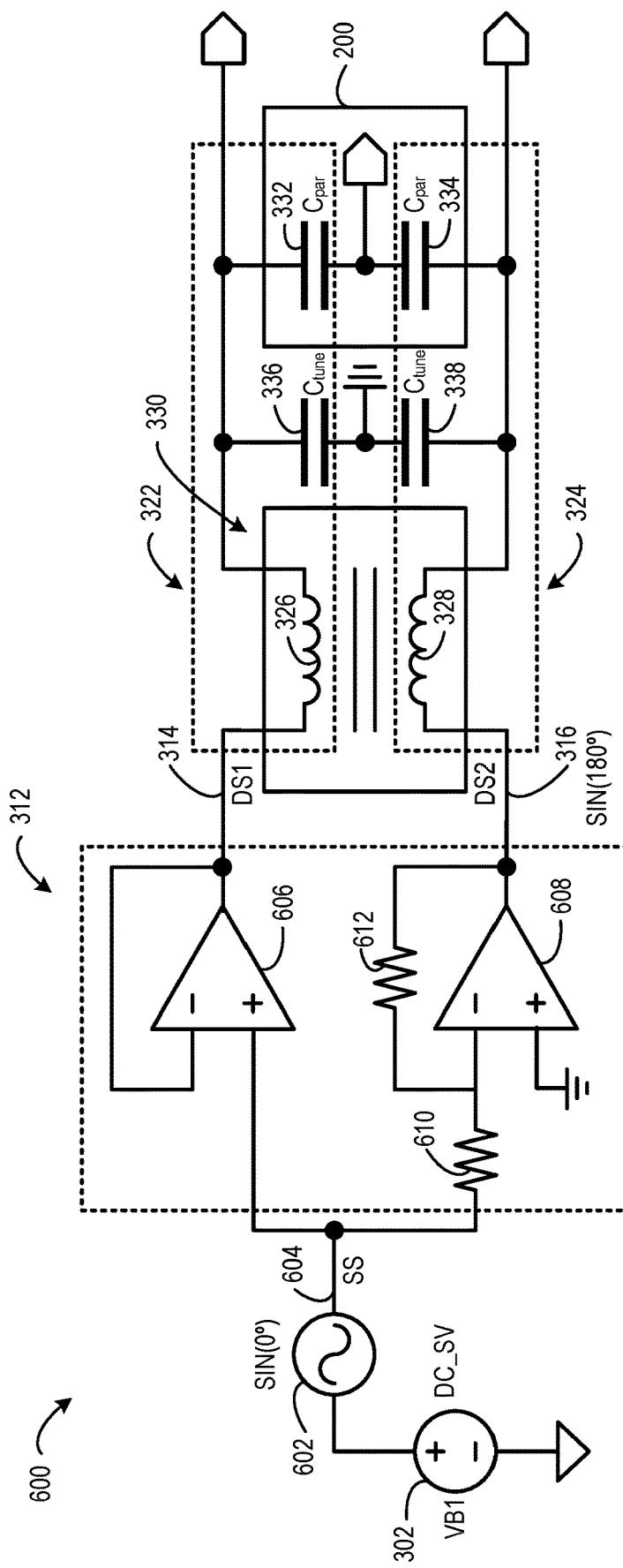

FIG. 6 shows another example drive circuit 600. The drive circuit 600 differs from the drive circuit 300 in that a single signal source 602 provides a single source signal 604 to the buffer stage 312. In the depicted example, the source signal 604 (SS) is a sinusoidal signal. The buffer stage 312 comprises a unity gain noninverting amplifier 606 that is configured to receive the source signal 604 and output the first drive signal 314. The buffer stage 312 further comprises an inverting amplifier 608 that is configured to invert the signal, thereby outputting a signal that is 180 degrees out of phase with the output of the noninverting amplifier 606. The resistance values of the first and second resistors 610, 612 may be configured such that the differential operational amplifier 608 inverts the source signal 604 with unity gain to generate the second drive signal 316 that is 180 degrees out of phase with the first drive signal 314.

The above described drive circuits are intended to be non-limiting and other drive circuit configurations that enable the linear LC resonant drive scheme to be performed as described herein are within the scope of the present disclosure.

Figure 7:
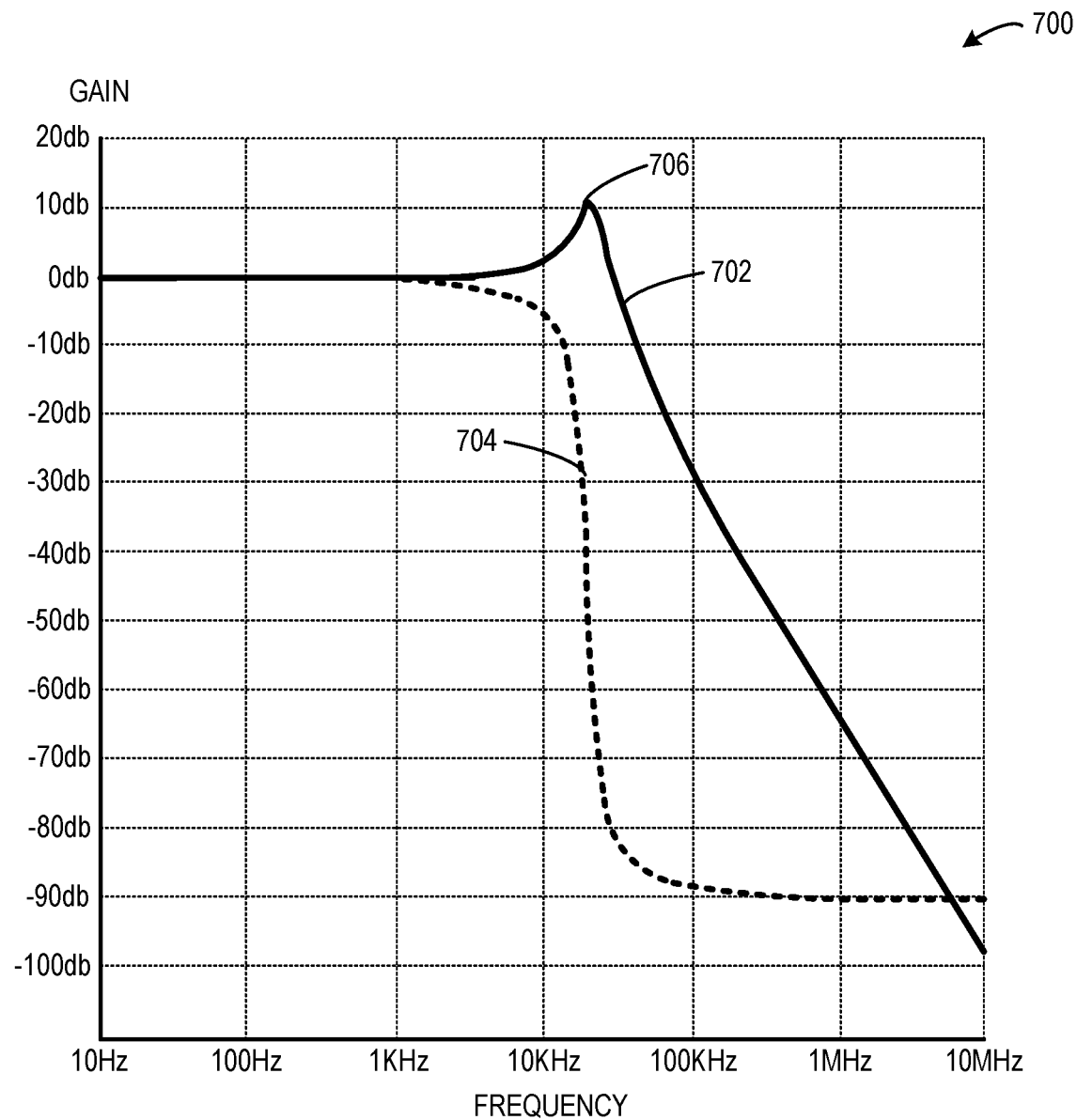
FIG. 7 is a graph showing a frequency response of an example drive circuit.

FIG. 7 is a graph 700 showing an example frequency response of a drive signal for driving a resonant scanning mirror system at a resonant frequency, such as the resonant scanning mirror system 200 shown in FIG. 2. For example, the drive signal may be generated by any of the drive circuits 300, 400, 500, and/or 600 shown in FIGS. 3-6. The horizontal axis of the graph 700 represents frequency and the vertical axis of the graph 700 represents gain. In particular, the frequency response 702 of the drive signal is indicated by the solid line and the phase 704 of the drive signal is indicated by the dotted line. It can be seen that the gain comprises a peak 706 of the at the mechanical resonant frequency of the resonant scanning mirror system (~25 kHz), and the declining values above and below the peak 706. It can be seen that the peak 706 of the frequency response 702 is offset from the phase 704.

Figure 8:
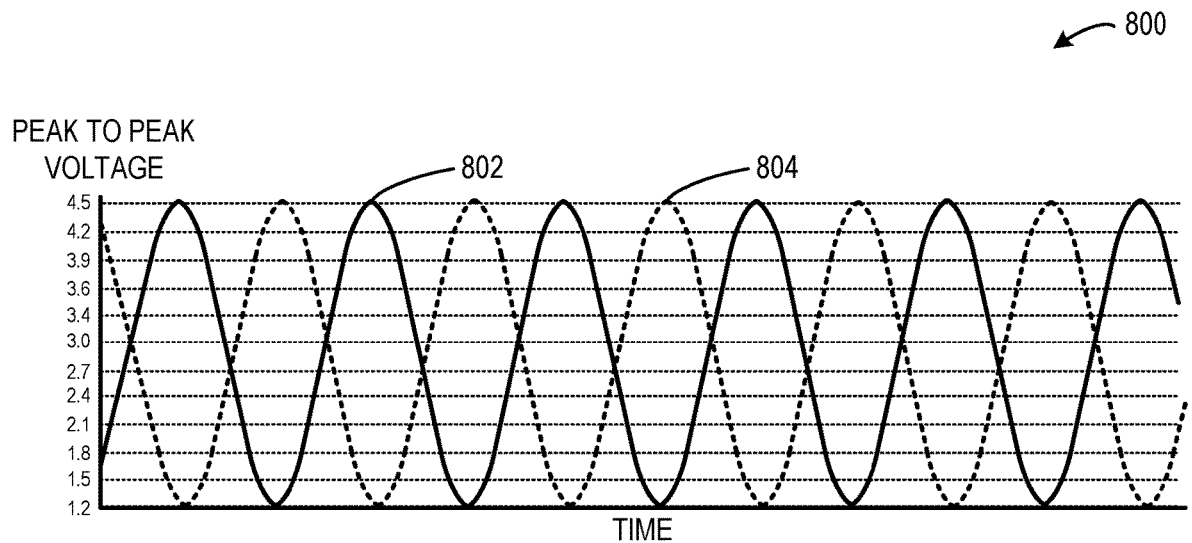
FIG. 8 is a graph showing example source signals for driving a resonant scanning mirror system.

FIG. 8 is a graph 800 showing example transient responses of source signals for driving a resonant scanning mirror system, such as the resonant scanning mirror system 200 shown in FIG. 2. The horizontal axis of the graph 800 represents time and the vertical axis of the graph 800 represents peak to peak voltage of the source signals. In particular, the first source signal 802 is indicated by a solid line and the second source signal 804 is indicated by a dotted line. Note that the first and second source signals 802, 804 are sinusoidal signals that are 180 degrees out of phase relative to each other.

Figure 9:
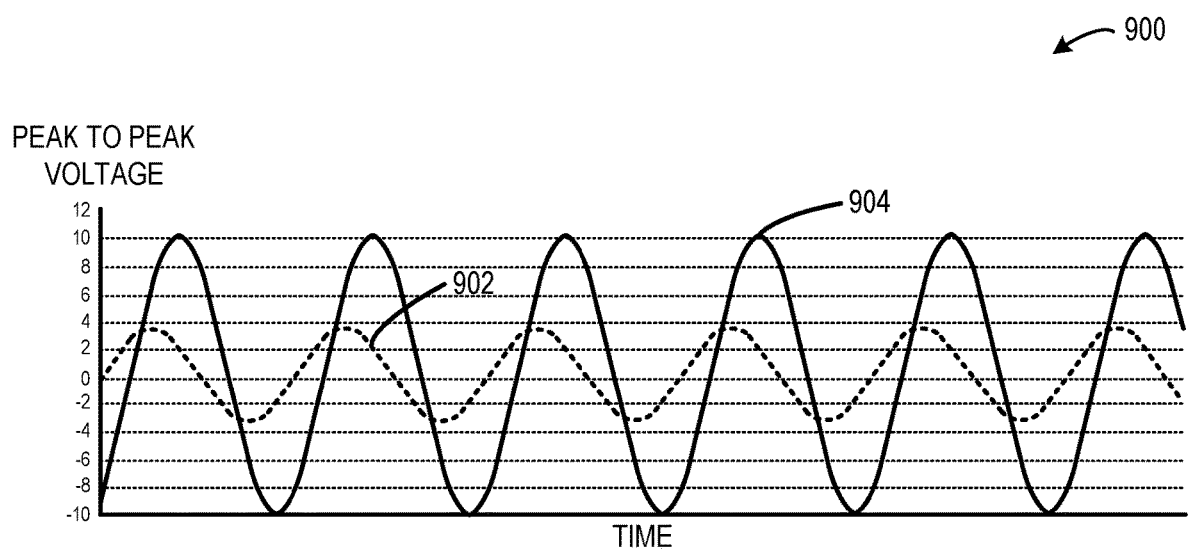
FIG. 9 is a graph showing example source and drive signals of a drive circuit for driving a resonant scanning mirror system.

FIG. 9 is a graph 900 showing example differential source and drive signals of a drive circuit for driving a resonant scanning mirror system, such as the resonant scanning mirror system 200 shown in FIG. 2. For example, the drive signal may be generated by any of the drive circuits 300, 400, 500, and/or 600 shown in FIGS. 3-6. The horizontal axis of the graph 800 represents time and the vertical axis of the graph 800 represents peak to peak voltage of the input and out signals. In particular, the differential input signal 902 is indicated by a dotted line and the differential output signal 904 is indicated by a solid line. The differential input signal 902 has a peak to peak voltage of ~6 volts while the differential output signal 904 has a peak to peal voltage of ~20 volts. Note that the amplitude ranges of these differential input and output signals are presented for the purpose of example and are not limiting. It will be appreciated that a drive circuit may use a linear LC drive scheme to amplify an input signal having any suitable input amplitude to output an amplified output signal having any suitable output amplitude. Also, note that the differential output signal 904 is phase shifted relative to the differential input signal 902 as a result of the resonant peak having a phase offset (as shown in FIG. 7).

Figure 10:
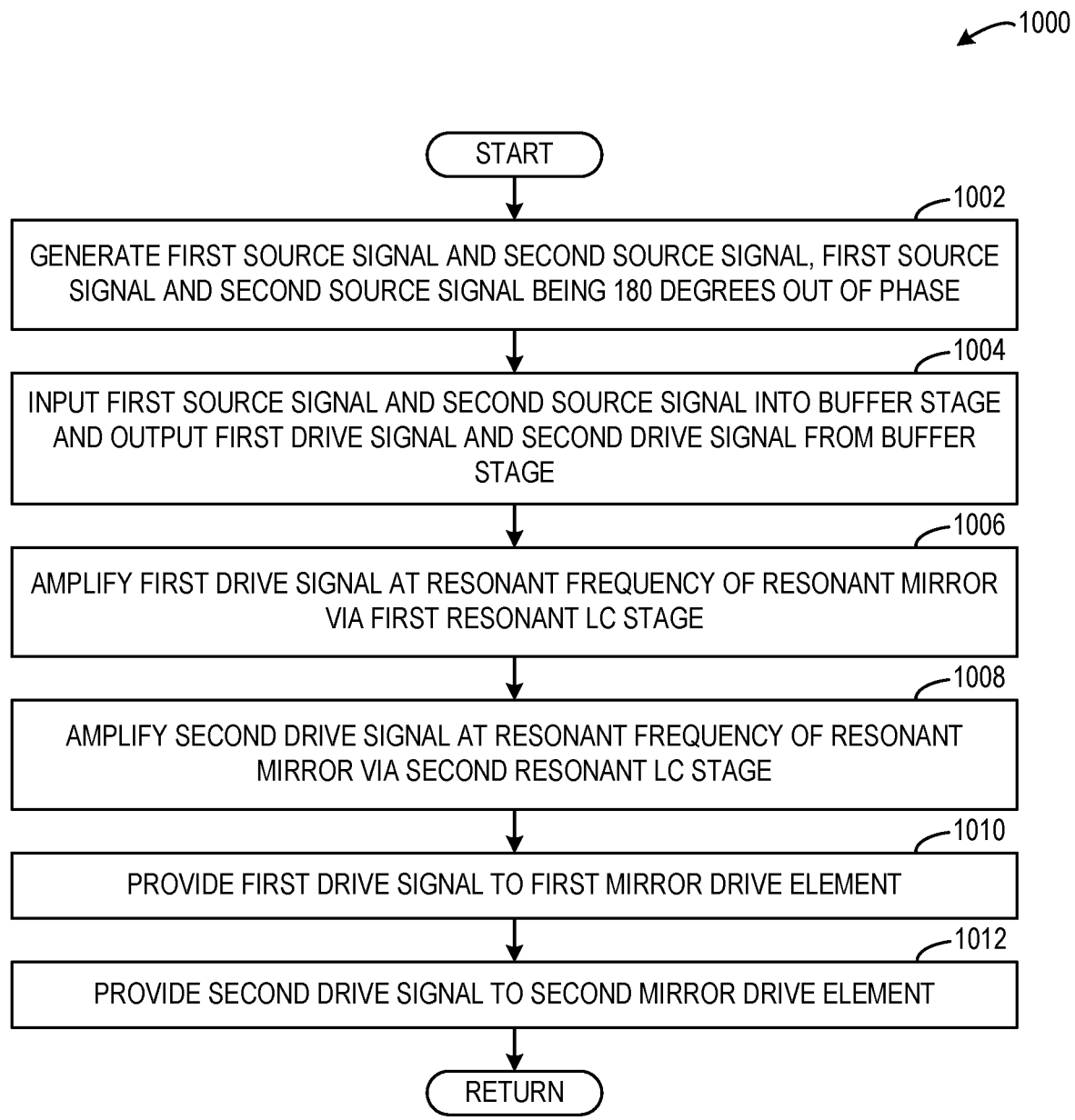
FIG. 10 shows an example method of operating a resonant scanning mirror system of a display device.

FIG. 10 shows an example method 1000 of operating a resonant scanning mirror system of a display device. The method 1000 may be performed by any of the drive circuits 300, 400, 500, and/or 600 shown in FIGS. 3-6 to operate the resonant scanning mirror system 200 shown in FIG. 2, as examples. At 1002, a first source signal and a second source signal may be generated, such that the first source signal and the second source signal are 180 degrees out of phase. The first and second source signals may be generated by one or more signals sources, such as the first and second signal sources 304, 308 shown in FIG. 3. At 1004, the first source signal and the second source signal are input into a buffer stage and a first drive signal and a second drive signal are output from the buffer stage. For example, the buffer stage 312 shown in FIG. 3 may buffer the first and second source signals 306, 310 to output the first and second drive signals 314, 316. In some examples, inputting the first source signal and the second source signal into a buffer stage comprises inputting the first source signal and the second source signal into a unity gain stage.

At 1006, the first drive signal is amplified at a resonant frequency of a resonant mirror via a first resonant LC stage. For example, the first drive signal 314 may be amplified by the first resonant LC stage 322 shown in FIG. 3. At 1008, the second drive signal is amplified at the resonant frequency of the resonant mirror via a second resonant LC stage. For example, the second drive signal 314 may be amplified by the second resonant LC stage 324 shown in FIG. 3. In some example, the first drive signal may be amplified at the resonant frequency of the resonant mirror via the first resonant LC stage by utilizing a first winding of a coupled inductor, and the second drive signal may be amplified at the resonant frequency of the resonant mirror via a second resonant LC stage by utilizing a second winding of the coupled inductor. In other examples, discrete inductors may be used. Further, in some examples, the first drive signal may be amplified at the resonant frequency of the resonant mirror via the first resonant LC stage by utilizing a first parasitic capacitance of the scanning mirror system, and the second drive signal may be amplified at the resonant frequency of the resonant mirror via a second resonant LC stage by utilizing a second parasitic capacitance of the scanning mirror system inductor. In some examples, the first drive signal may be amplified at the resonant frequency of the resonant mirror via the first resonant LC stage by utilizing one or more tuning capacitors. At 1010, the first drive signal is provided to a first mirror drive element. For example, the first drive signal may be provided to the first drive element 208 of the resonant mirror drive system 200 shown in FIG. 2. At 1012, the second drive signal is provided to a second mirror drive element. For example, the second drive signal may be provided to the second drive element 210 of the resonant mirror drive system 200 shown in FIG. 2.

By operating a resonant scanning mirror system of a display device according to the method 900 that employs a linear LC resonant drive scheme, the resonant scanning mirror system may be driven in a power efficient and reliable manner. Furthermore, since peak voltage is applied only near the resonant frequency of the resonant scanning mirror system, the resonant scanning mirror system and other electrical components of the drive circuit may be less susceptible to PVT variations and other over voltage conditions that can cause degradation of such electrical components.

In an example, a display device comprises a resonant scanning mirror system comprising a scanning mirror, a first mirror drive element, and a second mirror drive element, and a drive circuit configured to drive the scanning mirror at a resonant frequency, the drive circuit comprising one or more signal sources configured to create a first source signal and a second source signal, the first source signal being 180 degrees out of phase with the second source signal, a buffer stage configured to receive the first source signal and the second source signal and to output a first drive signal and a second drive signal, a first resonant LC stage configured to amplify the first drive signal for provision to the first mirror drive element, and a second resonant LC stage configured to amplify the second drive signal for provision to the second mirror drive element. In this example and/or other examples, the buffer stage optionally may comprise an operational amplifier stage. In this example and/or other examples, the operational amplifier stage optionally may comprise a unity gain stage. In this example and/or other examples, the first resonant LC stage optionally may comprise a first winding of a coupled inductor, and the second resonant LC stage optionally may comprise a second winding of the coupled inductor. In this example and/or other examples, the first resonant LC stage optionally may utilize a first parasitic capacitance of the scanning mirror system, and the second resonant LC stage optionally may utilize a second parasitic capacitance of the scanning mirror system. In this example and/or other examples, the first resonant LC stage optionally may further comprise a first tuning capacitor. In this example and/or other examples, the first mirror drive element optionally may comprise a first piezoelectric drive element, and the second mirror drive element optionally may comprise a second piezoelectric drive element. In this example and/or other examples, the display device optionally may comprise a head-mounted display.

In another example, a display device, comprises a resonant scanning mirror system comprising a scanning mirror, a first mirror drive element, and a second mirror drive element, and a drive circuit configured to drive the scanning mirror at a resonant frequency, the drive circuit comprising one or more signal sources configured to create a first source signal and a second source signal, the first source signal being 180 degrees out of phase with the second source signal, a buffer stage configured to receive the first source signal and the second source signal and to output a first drive signal and a second drive signal respectively based upon the first source signal and the second source signal, a first resonant LC stage configured to amplify the first drive signal for provision to the first mirror drive element, the first resonant LC stage comprising a first winding of a coupled inductor, and a second resonant LC stage configured to amplify the second drive signal for provision to the second mirror drive element, the second resonant LC stage comprising a second winding of a coupled inductor. In this example and/or other examples, the operational amplifier stage optionally may comprise a unity gain stage. In this example and/or other examples, the first resonant LC stage optionally may utilize a first parasitic capacitance of the scanning mirror system, and the second resonant LC stage optionally may utilize a second parasitic capacitance of the scanning mirror system. In this example and/or other examples, the first resonant LC stage optionally may further comprise a first tuning capacitor. In this example and/or other examples, the first mirror drive element optionally may comprise a first piezoelectric drive element, and the second mirror drive element optionally may comprise a second piezoelectric drive element. In this example and/or other examples, the display device optionally may comprise a head-mounted display.

In yet another example, a method of operating a scanning mirror system of a display device comprises generating a first source signal and a second source signal, the first source signal and the second source signal being 180 degrees out of phase, inputting the first source signal and the second source signal into a buffer stage and outputting a first drive signal and a second drive signal from the buffer stage, amplifying the first drive signal at a resonant frequency of a resonant mirror via a first resonant LC stage, amplifying the second drive signal at the resonant frequency of the resonant mirror via a second resonant LC stage, providing the first drive signal to a first mirror drive element, and providing the second drive signal to a second mirror drive element. In this example and/or other examples, inputting the first source signal and the second source signal into a buffer stage optionally may comprise inputting the first source signal and the second source signal into a unity gain stage. In this example and/or other examples, amplifying the first drive signal at the resonant frequency of the resonant mirror via the first resonant LC stage optionally may comprise utilizing a first winding of a coupled inductor, and amplifying the second drive signal at the resonant frequency of the resonant mirror via a second resonant LC stage optionally may comprise utilizing a second winding of the coupled inductor. In this example and/or other examples, amplifying the first drive signal at the resonant frequency of the resonant mirror via the first resonant LC stage optionally may comprise utilizing a first parasitic capacitance of the scanning mirror system, and amplifying the second drive signal at the resonant frequency of the resonant mirror via a second resonant LC stage optionally may comprise utilizing a second parasitic capacitance of the scanning mirror system inductor. In this example and/or other examples, amplifying the first drive signal at the resonant frequency of the resonant mirror via the first resonant LC stage optionally further comprise utilizing a first tuning capacitor. In this example and/or other examples, the display device optionally may comprise a head-mounted display.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A display device, comprising:
a resonant scanning minor system comprising a scanning minor, a first mirror drive element, and a second minor drive element; and
a drive circuit configured to drive the scanning mirror at a resonant frequency, the drive circuit comprising
one or more signal sources configured to create a first source signal and a second source signal, the first source signal being 180 degrees out of phase with the second source signal;
a buffer stage configured to receive the first source signal and the second source signal and to output a first drive signal and a second drive signal;
a first resonant LC stage configured to amplify the first drive signal for provision to the first mirror drive element; and
a second resonant LC stage configured to amplify the second drive signal for provision to the second mirror drive element.

2. The display device of claim 1, wherein the buffer stage comprises an operational amplifier stage.

3. The display device of claim 2, wherein the operational amplifier stage comprises a unity gain stage.

4. The display device of claim 1, wherein the first resonant LC stage comprises a first winding of a coupled inductor, and wherein the second resonant LC stage comprises a second winding of the coupled inductor.

5. The display device of claim 1, wherein the first resonant LC stage utilizes a first parasitic capacitance of the scanning mirror system, and wherein the second resonant LC stage utilizes a second parasitic capacitance of the scanning mirror system.

6. The display device of claim 5, wherein the first resonant LC stage further comprises a first tuning capacitor.

7. The display device of claim 1, wherein the first minor drive element comprises a first piezoelectric drive element, and wherein the second minor drive element comprises a second piezoelectric drive element.

8. The display device of claim 1, wherein the display device comprises a head-mounted display.

9. A display device, comprising:
a resonant scanning minor system comprising a scanning minor, a first mirror drive element, and a second minor drive element; and
a drive circuit configured to drive the scanning minor at a resonant frequency, the drive circuit comprising
one or more signal sources configured to create a first source signal and a second source signal, the first source signal being 180 degrees out of phase with the second source signal;
a buffer stage configured to receive the first source signal and the second source signal and to output a first drive signal and a second drive signal respectively based upon the first source signal and the second source signal;

a first resonant LC stage configured to amplify the first drive signal for provision to the first mirror drive element, the first resonant LC stage comprising a first winding of a coupled inductor; and a second resonant LC stage configured to amplify the second drive signal for provision to the second mirror drive element, the second resonant LC stage comprising a second winding of a coupled inductor.

10. The display device of claim 9, wherein the buffer stage comprises a unity gain stage.

11. The display device of claim 9, wherein the first resonant LC stage utilizes a first parasitic capacitance of the scanning mirror system, and wherein the second resonant LC stage utilizes a second parasitic capacitance of the scanning mirror system.

12. The display device of claim 11, wherein the first resonant LC stage further comprises a first tuning capacitor.

13. The display device of claim 9, wherein the first minor drive element comprises a first piezoelectric drive element, and wherein the second minor drive element comprises a second piezoelectric drive element.

14. The display device of claim 9, wherein the display device comprises a head-mounted display.

15. A method of operating a scanning minor system of a display device, comprising:

generating a first source signal and a second source signal, the first source signal and the second source signal being 180 degrees out of phase;

inputting the first source signal and the second source signal into a buffer stage and outputting a first drive signal and a second drive signal from the buffer stage;

amplifying the first drive signal at a resonant frequency of a resonant minor via a first resonant LC stage;

amplifying the second drive signal at the resonant frequency of the resonant mirror via a second resonant LC stage;

providing the first drive signal to a first minor drive element; and providing the second drive signal to a second mirror drive element.

16. The method of claim 15, wherein inputting the first source signal and the second source signal into a buffer stage comprises inputting the first source signal and the second source signal into a unity gain stage.

17. The method of claim 15, wherein amplifying the first drive signal at the resonant frequency of the resonant mirror via the first resonant LC stage comprises utilizing a first winding of a coupled inductor, and wherein amplifying the second drive signal at the resonant frequency of the resonant mirror via a second resonant LC stage comprises utilizing a second winding of the coupled inductor.

18. The method of claim 15, wherein amplifying the first drive signal at the resonant frequency of the resonant mirror via the first resonant LC stage comprises utilizing a first parasitic capacitance of the scanning mirror system, and wherein amplifying the second drive signal at the resonant frequency of the resonant mirror via a second resonant LC stage comprises utilizing a second parasitic capacitance of the scanning minor system inductor.

19. The method of claim 15, wherein amplifying the first drive signal at the resonant frequency of the resonant mirror via the first resonant LC stage further comprises utilizing a first tuning capacitor.

20. The method of claim 15, wherein the display device comprises a head-mounted display.

* * * * *